United States Patent
Chung et al.

(10) Patent No.: US 6,590,421 B2
(45) Date of Patent: Jul. 8, 2003

(54) SEMICONDUCTOR DEVICE AND METHOD OF OUTPUTTING DATA THEREIN

(75) Inventors: Hoe-Ju Chung, Suwon (KR); Kyu-Hyoun Kim, Suwon (KR); Il-Won Seo, Seoul (KR); Moo-Sung Chae, Seoul (KR)

(73) Assignee: Samsung Electronics Co., Ltd., Suwon (KR)

( * ) Notice: Subject to any disclaimer, the term of this patent is extended or adjusted under 35 U.S.C. 154(b) by 0 days.

(21) Appl. No.: 10/101,475

(22) Filed: Mar. 19, 2002

(65) Prior Publication Data

US 2002/0149403 A1 Oct. 17, 2002

(30) Foreign Application Priority Data

Mar. 19, 2001 (KR) ........................................ 2001-14112

(51) Int. Cl.[7] ......................................... H03K 19/0175
(52) U.S. Cl. ............................. 326/83; 326/93; 326/26
(58) Field of Search ............................. 326/83, 86, 93, 326/26, 27, 28

(56) References Cited

U.S. PATENT DOCUMENTS

| | | | | |
|---|---|---|---|---|
| 5,332,932 A | * | 7/1994 | Runaldue | 326/33 |
| 5,355,029 A | * | 10/1994 | Houghton et al. | 326/26 |
| 5,838,177 A | * | 11/1998 | Keeth | 327/108 |
| 6,028,488 A | * | 2/2000 | Landman et al. | 331/1 A |
| 6,271,699 B1 | * | 8/2001 | Dowlatabadi | 327/170 |

* cited by examiner

Primary Examiner—Don Le
(74) Attorney, Agent, or Firm—F. Chau & Associates, LLP

(57) ABSTRACT

A semiconductor capable of reducing skew between plural-bit output data by using a plurality of data output drivers and a method thereof. Each data output driver comprises a driver connected between an external power voltage and an external ground voltage, for pulling-up the output data in response to a first state of input data and for pulling-down the output data in response to a second state of the input data; a first delay circuit for varying transition delay time of the input data having the first state in response to signals received from other data output drivers; and a second delay circuit for varying transition delay time of the input data having the second state in response to signals received from other data output drivers.

19 Claims, 6 Drawing Sheets

SEMICONDUCTOR DEVICE AND METHOD OF OUTPUTTING DATA THEREIN

CROSS-REFERENCE TO RELATED APPLICATION

This application claims priority to Korean Patent Application No. 2001-14112, filed on Mar. 19, 2001, which is commonly owned and incorporated by reference herein.

BACKGROUND

1. Technical Field

The present invention relates to a semiconductor device, and more particularly, to a semiconductor device capable of minimizing skew between plural-bit output data and a method thereof.

2. Description of Related Art

Semiconductor devices that output data comprising a large number of bits typically output the data bits simultaneously (i.e., in parallel). When the logic levels of the plural-bit output data simultaneously transition, a large amount of electrical current is applied to a power line, which causes a transition noise due to parasitic components of the power line. As a result, output data can be delayed and distorted.

Further, if a portion of the output data transits in one direction to a logic state (e.g., from a logic "high" to a logic "low" level), and another portion of the output data transits in the opposite direction (e.g., from a logic "low" to a logic "high" level), a delay time difference occurs between the output data because of the difference of the transition directions. As a result, skew occurs between the output data. The skew will increase as the number of bits comprising the output data increases, the parasitic components increase, and as the operation speed increases.

FIG. 1 is a circuit diagram illustrating a conventional data output circuit. The data output circuit comprises a plurality of data output drivers 10-1 to 10-n, parasitic components 12 and 14, and a capacitor C3. The data output drivers 10-1 to 10-n drive input data bits D1 to Dn to generate output data bits DQ1 to DQn, respectively. Each of the data output drivers 10-1 to 10-n comprises an inverter comprising a PMOS transistor P1 and an NMOS transistor N1. The parasitic component 12 is represented by a resistor R1, an inductor L1, and a capacitor C1, connected between an external power voltage VDDQ and each power voltage terminal of the data output drivers 10-1 to 10-n. The parasitic component 14 is represented by a resistor R2, an inductor L2 and a capacitor C2, connected between an external ground voltage VSSQ and each ground voltage terminal of the data output drivers 10-1 to 10-n.

The data output drivers 10-1 to 10-n drive the input data bits D1 to Dn to generate the output data bits DQ1 to DQn, respectively. When the output data bits DQ1 to DQn change their logic levels (e.g., from a high level to a low level or vice versa), a large amount of current is drawn through power lines for receiving the external power voltage VDDQ and for receiving the external ground voltage VSSQ. Consequently, a transition noise occurs due to the parasitic components 12 and 14. The capacitor C3 is connected between the parasitic components 12 and 14 for interactively changing the external power voltage VDDQ and the external ground voltage.

FIGS. 2A to 2C are graphs illustrating a relationship between the external power voltage VDDQ the external ground voltage VSSQ, and the output data bits DQ1 to DQn of FIG. 1, during logic level transitions of output data bits DQ1 to DQn.

As illustrated in FIG. 2A, when input data bits D1 to D((n+2) transition from a logic "low" level to a logic "high" level and input data bits D((n+1)/2) to Dn transition from a logic "high" level to a logic "low" level, output data bits DQ1 to DQ(n/2) transition from a logic "high" level to a logic "low" level and output data bits DQ((n+1)/2) to DQn transition from a logic "low" level to a logic "high" level. Because of the transition of each of the n/2 bits, the level of the external power voltage VDDQ falls and a level of the external ground voltage VSSQ rises.

As further illustrated in FIG. 2B, when input data bits D1 to D(n-1) transition from a logic "low" level to a logic "high" level and input data bit Dn transitions from a logic "high" level to a logic "low" level, output data bits DQ1 to DQ(n-1) transition from a logic "high" level to a logic "low" level and output data bit DQn transitions from a logic "low" level to a logic "high" level.

At this moment, because the input data bits D1 to D(n-1) transition from a logic "low" level to a logic "high" level, the voltage levels of the external ground voltage VSSQ and the external power voltage VDDQ rise significantly due to the capacitor C3. Consequently, a threshold voltage of each NMOS transistor N1 of the data output drivers 10-1 to 10-n rises, causing the transition time from a logic "high" to a logic "low" level of the output data bits DQ1 to DQ(n-1) to become slower as shown in FIG. 2B. Further, a threshold voltage of each PMOS transistor P1 of the data output drivers 10-1 to 10-n also rises, so that the transition time from a logic "low" to a logic "high" level of the output data bit DQn becomes faster. That is, skew occurs between output data bits DQ1 to DQ(n-1) and the output data bit DQn, as illustrated in FIG. 2B.

Further, as shown in FIG. 2C, when the transition time from a logic "low" to a logic "high" level of the output data bits DQ1 to DQ(n-1) becomes slower, and the transition time from a logic "high" to a logic "low" level of the output data bit DQn becomes faster, skew occurs between the output data bits DQ1 to DQ(n-1) and the output data bit DQn.

As described above, in conventional semiconductor devices, as the number of output bits increases, skew occurs between output data that transitions from a logic "high" level to a logic "low" level and other output data that transitions from a logic "low" level to a logic "high" level.

SUMMARY OF THE INVENTION

To overcome the above problems, it is an object of the present invention to provide a semiconductor device and output method thereof for minimizing skew between plural-bit output data.

According to one aspect of the present invention, a data output circuit of a semiconductor device comprises a plurality of data output drivers for generating plural-bit output data. Each data output driver comprises a driver connected between an external power voltage and an external ground voltage, for pulling-up the output data in response to a first state of input data and for pulling-down the output data in response to a second state of the input data; a first delay circuit for varying transition delay time of the input data having the first state, in response to signals received from other data output drivers; and a second delay circuit for varying transition delay time of the input data having the second state, in response to signals received from other data output drivers.

Preferably, the first delay circuit comprises a plurality of first switching devices, which are activated in response to the first state of the input data, for transitioning a level of the input data from the first state to the second state; and a plurality of first capacitors for delaying the transition delay time of the input data having the first state. Each of first capacitors are connected to a corresponding one of the first switching devices and an internal ground voltage. The second delay circuit preferably comprises a plurality of second switching devices, which are activated in response to the second state of the input data, for transitioning a level of the input data from the second state to the first state; and a plurality of second capacitors, connected between the plurality of the second switching devices and an internal ground voltage, for varying the transition delay time of the input data having the second state.

According to another aspect of the present invention, a semiconductor device comprises a controller for receiving plural-bit input data and a plurality of data output drivers. The plural-bit input data comprise a first group of bits that transition from a first state to a second state and a second group of bits that transition from the second state to the first state. The controller compares the number of bits in the first group and the number of bits in the second group to generate a falling transition delay time control signal and a rising transition delay time control signal. The plurality of data output drivers generate plural-bit output data in response to the plural-bit input data and the falling and rising transition delay time control signals.

According to another aspect of the present invention, a semiconductor device comprises a controller for receiving plural-bit input data, wherein the plural-bit input data comprises a first group of bits that transition from a first state to a second state and a second group of bits that transition from the second state to the first state, and wherein the controller compares the number of bits in the first group and the number of bits in the second group to generate a falling transition delay time control signal and a rising transition delay time control signal; a plurality of clock signal generators for receiving a clock signal and generating a delayed clock signal with respect to each of the plural-bit input data in response to the rising transition delay time control signal and the falling transition delay time control signal, respectively; a plurality of registers for receiving the plural-bit input data in response to the corresponding delayed clock signal, respectively; and a plurality of data output drivers for generating plural-bit output data in response to the output from the plurality of the registers, respectively.

According to further aspect of the present invention, a method is provided for outputting plural-bit output data in a semiconductor device comprising a plurality of data output drivers, in which the plurality of data output drivers are connected between an external power voltage and an external ground voltage, pull up the plural-bit output data is in response to plural-bit input data of a first state, and pull down the plural-bit output data in response to the plural-bit input data of a second state. The method comprises the steps of: receiving a first group of the plural-bit input data that transition from the second state to the first state and a second group of the plural-bit input data that transition from the first state to the second state; comparing the number of bits in the first group with the number of bits in the second group to generate a rising transition delay time control signal and a falling transition delay time control signal; controlling transition delay time of the first group and the second group in response to the rising transition delay time control signal and the falling transition delay time control signal, respectively; and generating the plural-bit output data in response to the plural-bit input data.

BRIEF DESCRIPTION OF THE DRAWINGS

For a more complete understanding of the present invention and the advantages thereof, reference is now made to the following descriptions taken in conjunction with the accompanying drawings, in which like reference numerals denote like parts, and in which.

DETAILED DESCRIPTION OF PREFERRED EMBODIMENTS

Figure 3:
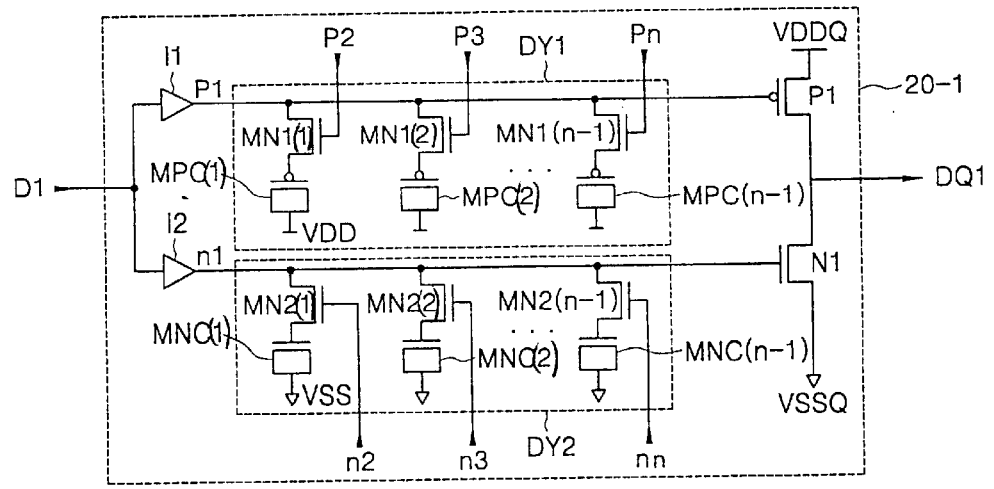
FIG. 3 is a circuit diagram illustrating a data output circuit according to one embodiment of the present invention.
Figure 3:
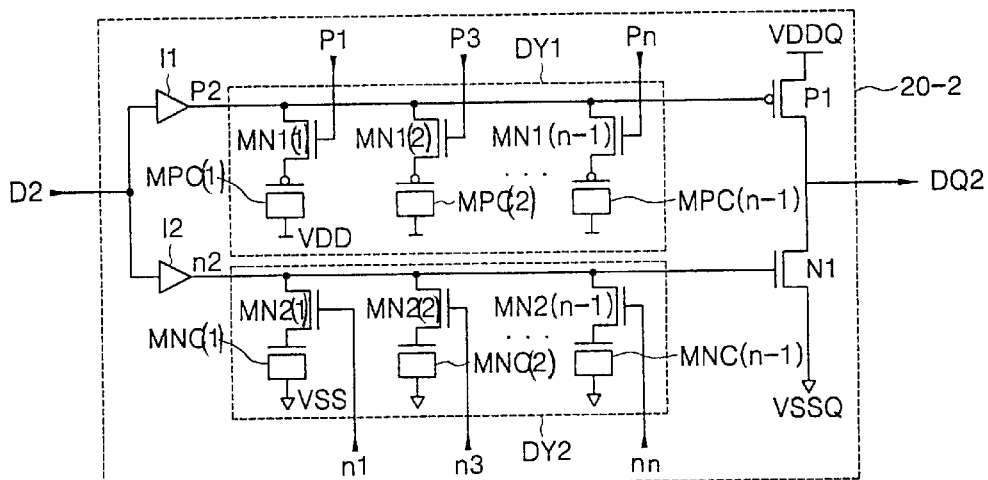
Figure 3:
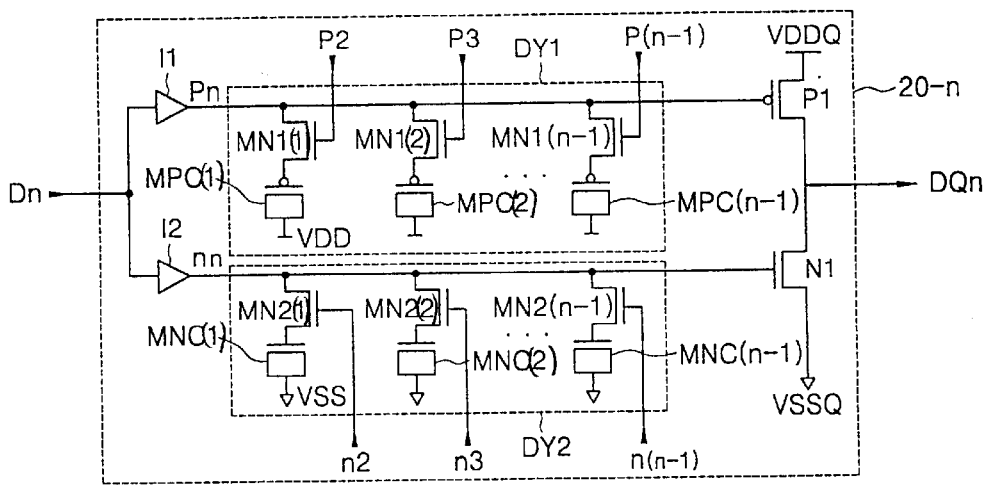

FIG. 3 is a circuit diagram illustrating a data output circuit according to one embodiment of the present invention. Referring to FIG. 3, a data output circuit comprises a plurality of data output drivers 20-1 to 20-n. Each of the data output drivers 20-1 to 20-n comprises buffers I1 and I2, delay circuits DY1 and DY2, a PMOS transistor P1, and an NMOS transistor N1.

The delay circuit DY1 comprises a plurality of NMOS transistors MN1(1) to MN1(n−1) serial-connected to each other and connected an output terminal of the buffer I1, and a plurality of PMOS capacitors MPC(1) to MPC(n−1) connected between respective NMOS transistors MN1(1) to MN1(n−1) and an internal power voltage VDD. The delay circuit DY2 comprises a plurality of NMOS transistors MN2(1) to MN2(n−1) serial-connected to each other and connected an output terminal of the buffer I2, and a plurality of NMOS capacitors MNC(1) to MNC(n−1) connected between respective NMOS transistors MN2(1) to MN2(n−1) and an internal ground voltage VSS.

The NMOS transistors MN1(1) to MN1(n−1) and the NMOS transistors MN2(1) to MN2(n−1) of each data output driver receive signals at their gate terminals from the output of buffers I1 and I2 from other drivers. For example, the NMOS transistors MN1(1) to MN1(n−1) and MN2(1) to MN2(n−1) of the delay circuits DY1 and DY2 of the data output driver 20-1 receive gate signals p2 to pn and n2 to nn from the output of buffers I1 and I2 of the data output drivers 20-2 to 20-n.

For each output driver 20-1 to 20-n, an external power voltage VDDQ is applied to the source of the PMOS transistor P1, and an external ground voltage VSSQ is applied to the source of the NMOS transistor N1. The PMOS transistor P1 and the NMOS transistor N1 are connected at their drains.

In output driver 20-1, for example, the buffer I1 buffers data D1 to generate a signal p1, and the buffer I2 buffers data bit D1 to generate signal n1. Each of the NMOS transistors MN1(1) to MN1(n−1) of the delay circuit DY1 turns on in response to corresponding gate signals p2 to pn having logic "low" levels. When the signal p1 having a logic "low" level is applied to the delay circuit DY1, the PMOS capacitors MPC(1) to MPC(n−1) turn on to delay the signal p1. Each of the NMOS transistors MN2(1) to MN2(n−1) of the delay circuit DY2 turns on in response to the signals n2 to nn having logic "high" levels. When the signal n1 having a logic "high" level is applied to the delay circuit DY2, the NMOS capacitors MNC(1) to MNC(n−1) turn on to delay the signal n1. The NMOS transistor MN1(1) makes output data bit DQ1 to change from a logic "low" level to a logic "high" level in response to the signal p1 having a logic "low" level, and the NMOS transistor MN21 makes the output data bit DQ1 to change from a logic "high" level to a logic "low" level in response to the signal n1 having a logic "high" level.

The other data output drivers 20-2 to 20-n operate similarly to the data output driver 20-1 and, thus detailed explanation of their operation is omitted to avoid redundancy.

By way of example, assume that "n" is 4 (i.e., output data comprises output data bits DQ1 to DQ4. Assume further that output data bits DQ1 to DQ3 transition from a logic "high" level to a logic "low" level, and output data bit DQ4 transitions from a logic "low" level to a logic "high" level. When the output data bits D1 to D3 transition from a logic "low" level to a logic "high" level and output data bit D4 transitions from a logic "high" level to a logic "low" level, the buffers I1 and I2 of each data output driver (e.g., 20-1 to 20-4) generate the buffered signals p1 to p3 and n1 to n3 having a logic "high" level and the buffered signals p4 and n4 having a logic "low" level.

At this time, in each delay circuit DY2 of three data output drivers (e.g., 20-1 to 20-3), the NMOS capacitors MNC(1) and MNC(2) turn on in response to the buffered signals n2 and n3, n1 and n3, and n1 and n2 to delay the signals n1 to n3. And then, each NMOS transistor N1 of the data output drivers 20-1 to 20-3 makes the output data bits DQ1 and DQ3 to change to a logic "low" level, in response to the signals n1 to n3, respectively. Meanwhile, in the delay circuit DY1 of the last data output driver (e.g., 204), the NMOS transistors MN1(1) to MN1(3) turn on in response to the buffered signals p1 to p3 having a logic "high" level, and the PMOS capacitors MPC(1) to MPC(3) turn on in response to the signal p1 having a logic "low" level to delay the signal p1. The PMOS transistor P1 of the data output driver 20-4 makes the output data bit DQ4 transition to a logic "high" level in response to the signal p1.

Figure 1:
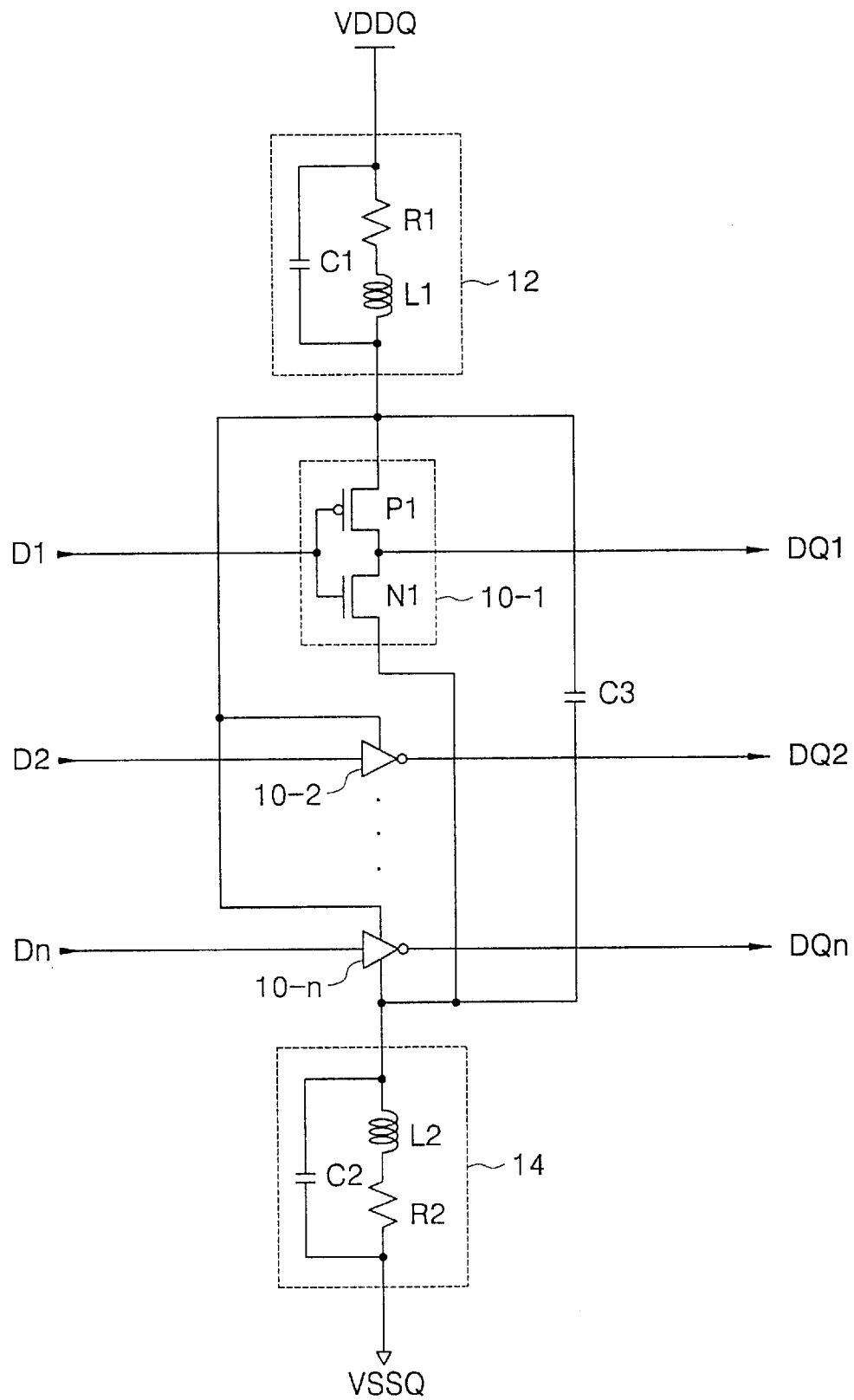
FIG. 1 is a circuit diagram illustrating a conventional data output circuit of a semiconductor device.
Figure 2A:
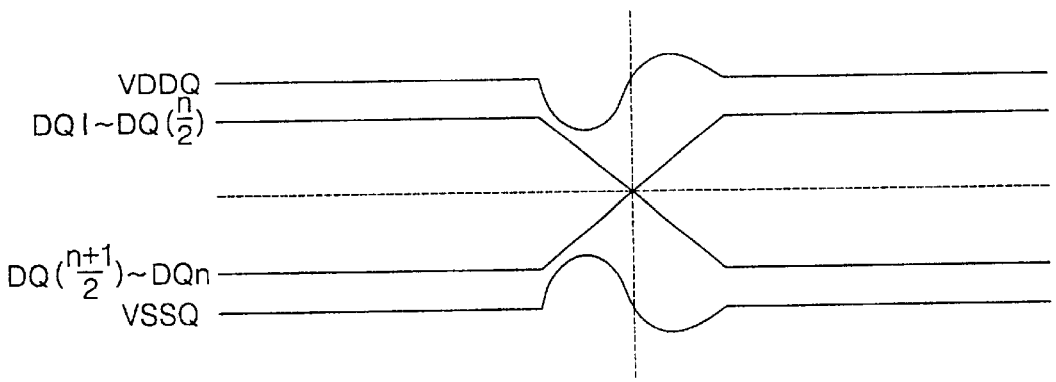
FIGS. 2A to 2C are graphs illustrating a relationship between an external power voltage, an external ground voltage and the output data of FIG. 1.
Figure 2B:
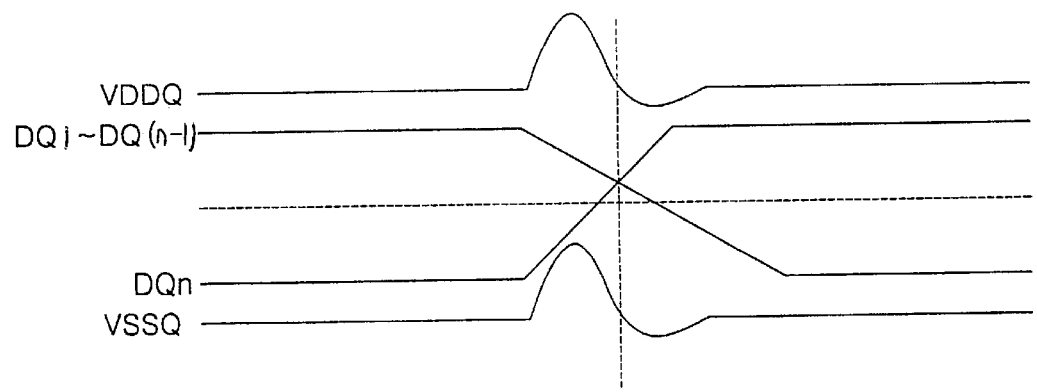
Figure 2C:
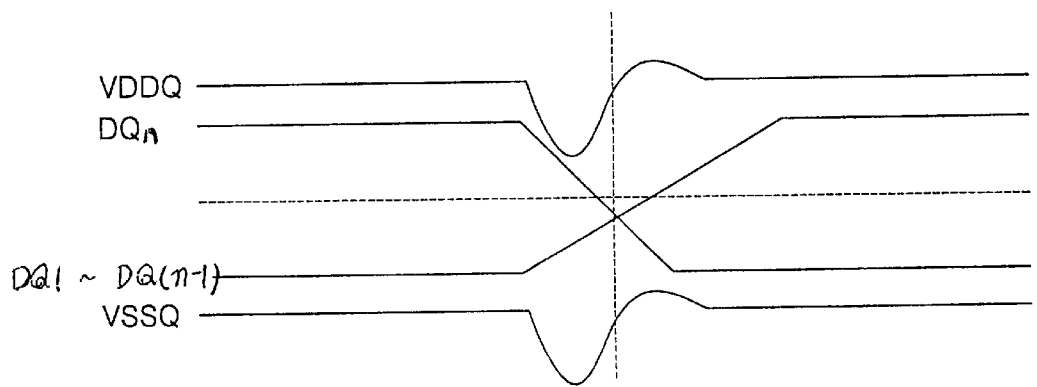

As described above, a transition of output data bit DQ4 from a logic "low" level to a logic "high" level is slower than the transitions of output data bits DQ1 to DQ3 from a logic "high" level to a logic "low" level, that is, the delay time of the output data bit DQ4 is longer than that of the output data bits DQ1 to DQ3. In contrast to the conventional data output circuit in which three-bit output data DQ1 to DQ3 are more delayed than the one-bit output data DQ4 as shown in FIG. 2B, in a data output circuit according to the embodiment as shown in FIG. 3, output data bit DQ4 is more delayed than output data bits DQ1 to DQ3 and thus, skew between four-bit output data DQ1 to DQ4 is reduced.

Figure 4:
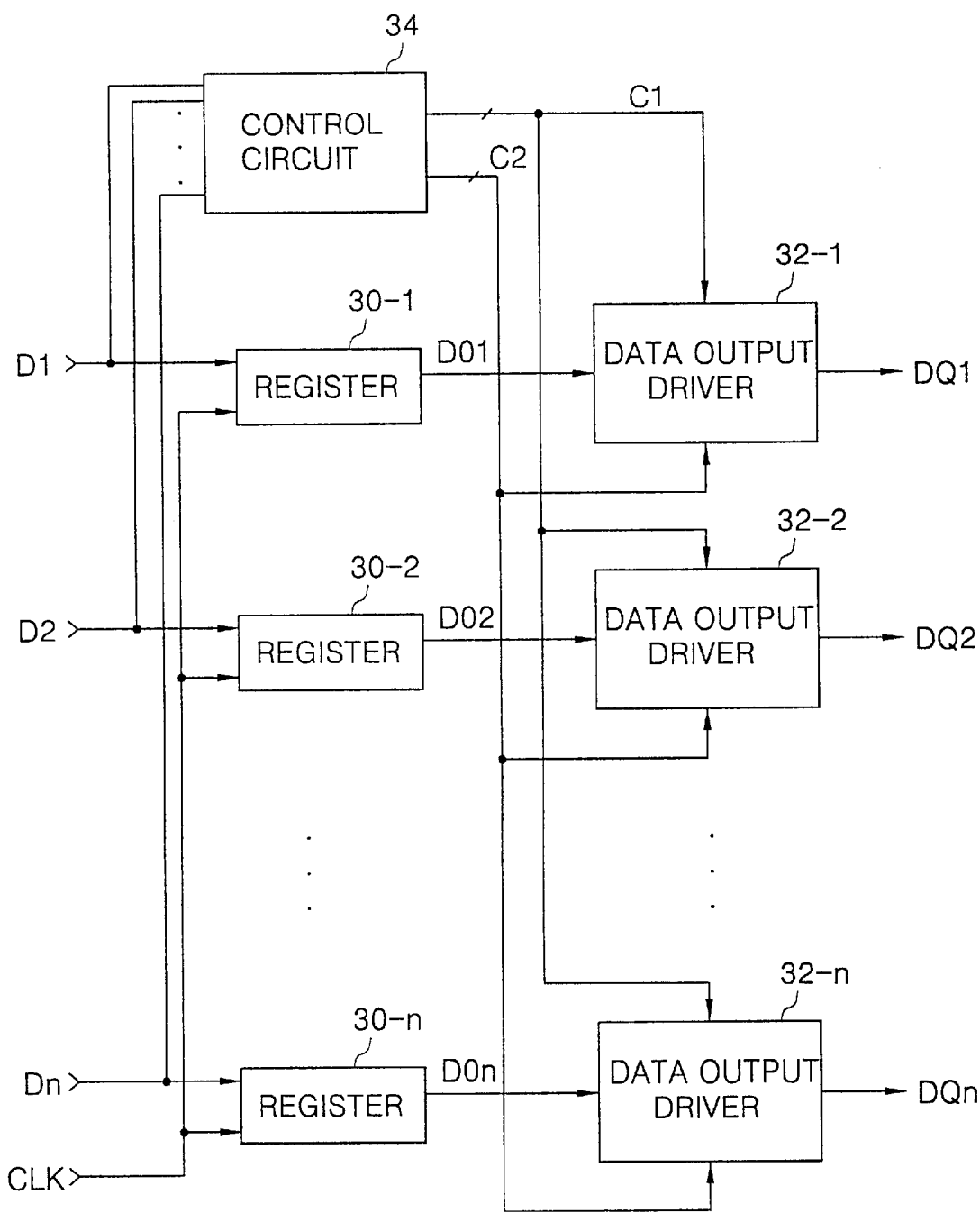
FIG. 4 is a block diagram illustrating a data output circuit according to another embodiment of the present invention.

FIG. 4 is a block diagram illustrating a data output circuit according to another embodiment of the present invention. The data output circuit of FIG. 4 comprises registers 30-1 to 30-n, data output drivers 32-1 to 32-n and a control circuit 34.

The registers 30-1 to 30-n receive respective input data bits D1 to Dn and output respective data bits D01 to D0n to the data output drivers 32-1 to 32-n, in response to a clock signal CLK.

The control circuit 34 receives the input data bits D1 to Dn and compares the number of data bits that transitioned to a logic "high" level with the number of data bits that transitioned to a logic "low" level, to thereby generate a falling transition delay time control signal C1 and a rising transition delay time control signal C2. When the number of data bits that transitioned to a logic "high" level is greater than the number of data bits that transitioned to a logic "low" level, the control circuit 34 makes the delay time of the bits that transitioned to a logic "low" level (i.e., the falling transition delay time) longer than the delay time of the data bits that transitioned to a logic "high" level (i.e., the rising transition delay time), thereby decreasing skew between the output data bits DQ1 to DQn. On the other hand, when the number of data bits that transitioned to a logic "low" level is greater than the number of data bits that transitioned to a logic "high" level, the control circuit 34 makes the rising transition delay time longer than the falling transition delay time, thereby decreasing skew between the output data bits DQ1 to DQn.

The data output drivers 32-1 to 32-n receive a corresponding one of the data bits D01 to D0n, and each driver 32-1 to 32-n receives the falling transition delay time control signal C1 and the rising transition delay time control signal C2 from the control circuit to generate output data bits DQ1 to DQn. In response to a rising transition delay time control signal C2 and the data bits D01 to D0n having a logic "low" level, the data output drivers 32-1 to 32-n generate output data bits DQ1 to DQn having a logic "high" level. And, in response to the falling transition delay time control signal C1 and the data bits D01 to D0n having a logic "high" level, the data output drivers 32-1 to 32-n generate the output data bits DQ1 to DQn having a logic "low" level.

In a data output circuit having an embodiment shown in FIG. 3, as the number of the output data bits DQ1 to DQn increases, the number of transistors of each delay circuit of the data output drivers increases, whereas in a data output circuit having an embodiment as shown in FIG. 4, the number of the transistors of each delay circuit of the data output drivers decreases. In particular, the data output circuit of FIG. 3 uses all the data bits as a control signal for controlling delay time, but the data output circuit of FIG. 4 divides the data bits into several data (having different bit number to use the divided bit data as a control signal. For example, 16-bit data is divided into two 8-bit data or four 4-bit data. Therefore, the number of the transistors of the delay circuits of each of the data output drivers could be decreased using the embodiment of FIG. 4.

Figure 5:
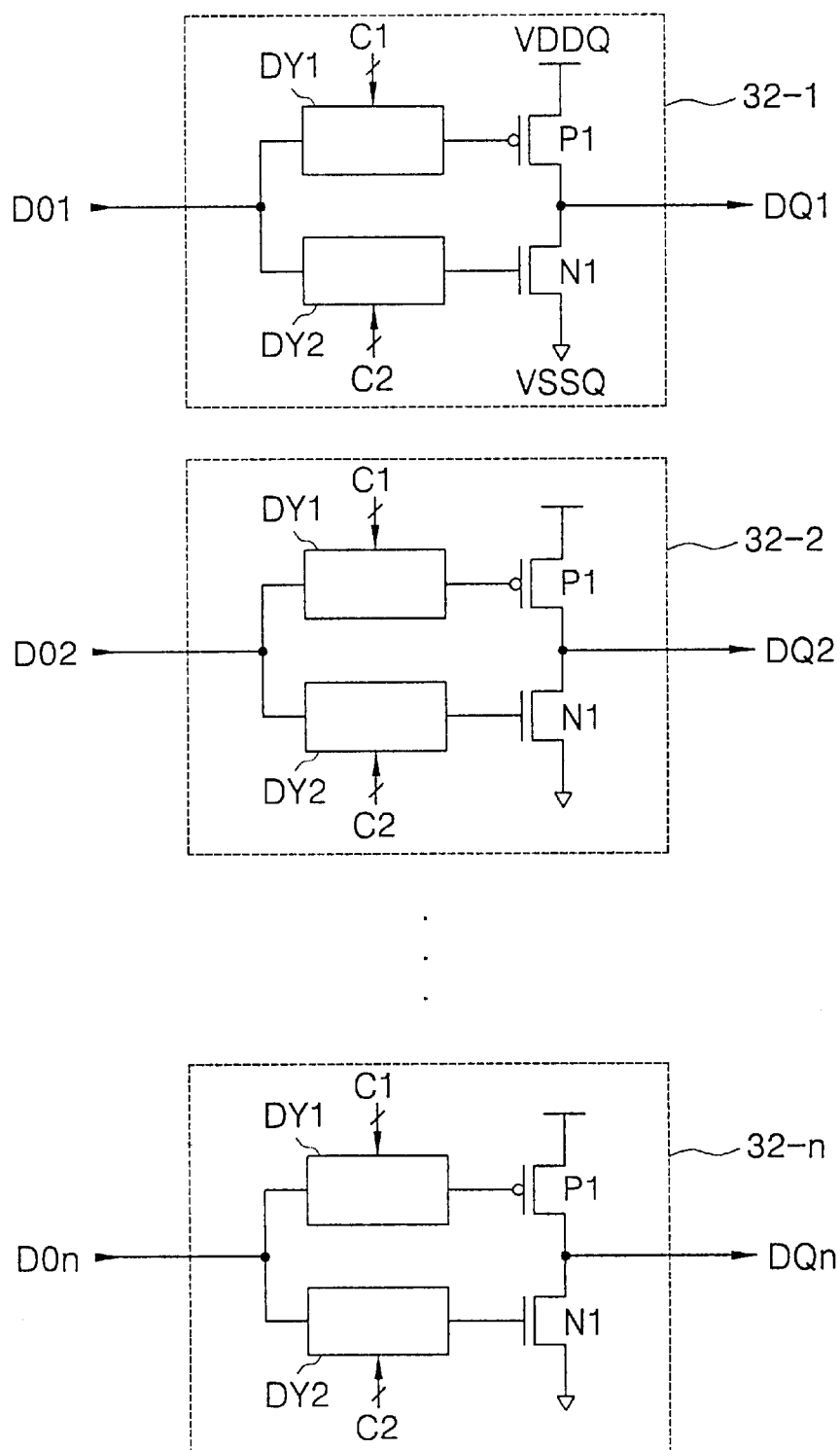
FIG. 5 is a block diagram illustrating a data output driver according to an embodiment of the present invention.

FIG. 5 is a block diagram illustrating an embodiment of a data output driver of FIG. 4 according to the present invention. Each of the data output drivers 32-1 to 32-n comprises delay circuits DY1 and DY2, a PMOS transistor P1 and an NMOS transistor N1.

The delay circuits of FIGS. 3 and 5 have similar configurations except that the delay circuits DY1 of FIG. 5 receive the falling transition delay time control signal C1, and the delay circuits DY2 of FIG. 5 receive the rising transition delay time control signal C2. Operation of the data output drivers of FIG. 5 can be understood with reference to FIG. 3 and thus their description is omitted to avoid redundancy.

Figure 6:
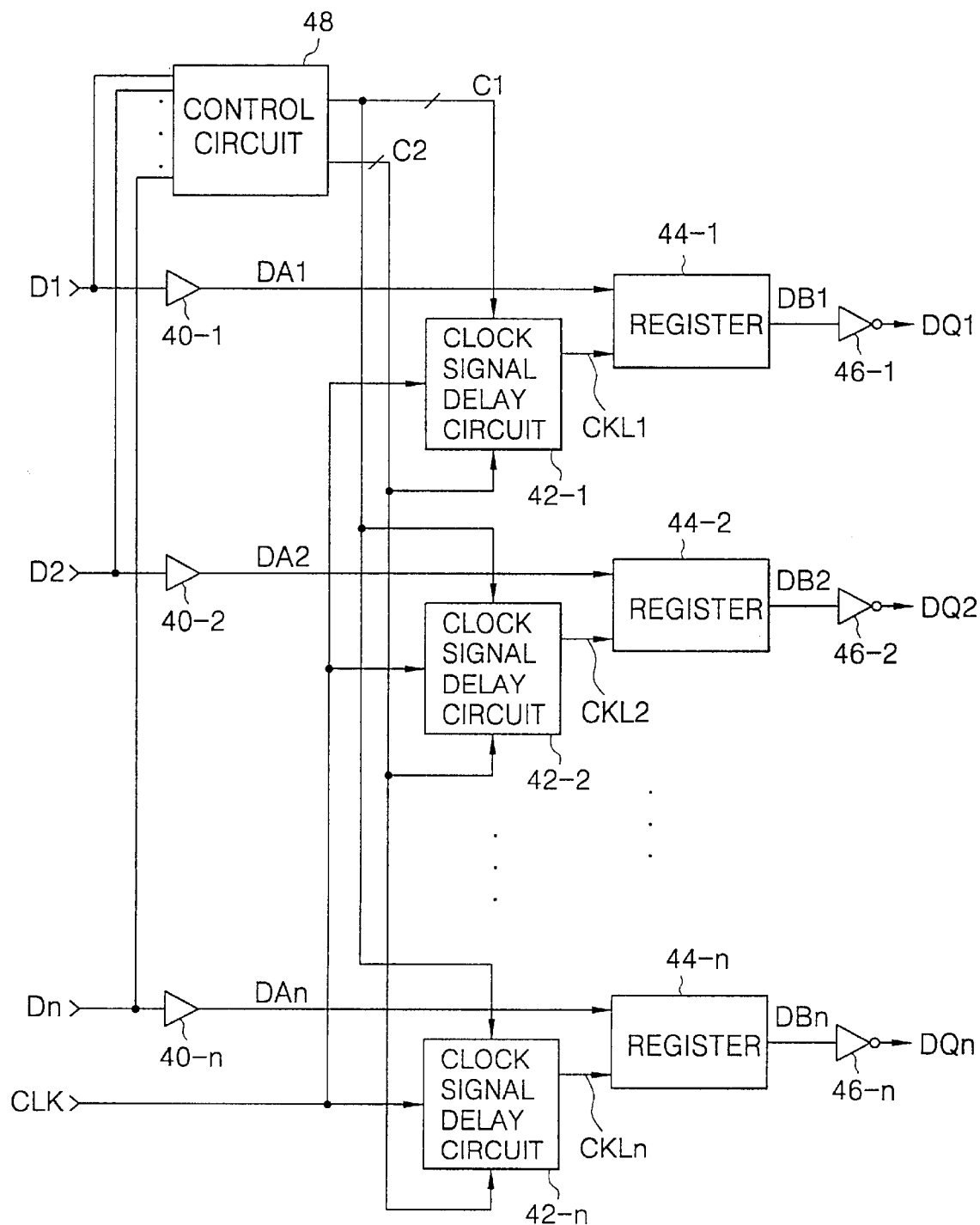
FIG. 6 is a block diagram illustrating a data output circuit according to another embodiment of the present invention.

FIG. 6 is a block diagram illustrating a data output circuit according to another embodiment of the present invention. The data output circuit of FIG. 6 comprises buffers 40-1 to 40-n, clock signal delay circuits 42-1 to 42-n, registers 44-1 to 44-n, data output drivers 46-1 to 46-n, and a control circuit 48.

The buffers 40-1 to **40-*n* buffer input data bits D1 to Dn and output data bits DA1 to Dan. The clock signal delay circuits 42-1 to 42-*n* delay a falling transition of a clock signal CLK in response to a falling transition delay time control signal C1 output from the control circuit 48 and delay a rising transition of the clock signal CLK in response to a rising transition delay time control signal C2 to generate clock signals CLK1 to CLKn. The registers 44-1 to 44-*n* generate data bits DB1 to DBn having a logic "low" level in response to a rising transition of the clock signals CLK1 to CLKn and generate data bits DB1 to DBn having a logic "high" level in response to a falling transition of the clock signals CLK1 to CLKn. Accordingly, the delay time of data that is output from the registers 44-1 to 44-*n* in response to the clock signals CLK1 to CLKn is controlled. The data output drivers 46-1 to 46-*n* drive the data bits DB1 to DBn to generate output data bits DQ1 to DQn. The control circuit 48** receives the data bits D1 to Dn and compares the number of data bits that transitioned to a logic "low" level with the number of data bits that transitioned to a logic "high" level, to thereby generate the falling transition delay time control signal C1 or the rising transition delay time control signal C2.

In the data output circuit of FIG. 6, the falling transition and the rising transition of the clock signals CLK1 to CLKn are controlled by the control signals C1 and C2 to thereby decrease the skew between the output data bits DQ1 to DQn. The clock signal delay circuits 42-1 to **42-*n* of FIG. 6 comprise the same configuration as the data output drivers 32-1 to 32-*n*** of FIG. 5 except that the clock signal CLK is applied thereto instead of the data bits D1 to Dn.

As described herein before, the semiconductor device compares the number of data bits that transitioned to a logic "high" level with the number of data bits that transitioned to a logic "low" level, to control a delay time of the plural-bit output data, thereby decreasing skew between the plural-bit output data.

While the invention has been particularly shown and described with reference to preferred embodiments thereof, it will be understood by those skilled in the art that the foregoing and other changes in form and details may be made therein without departing from the spirit and scope of the invention.

What is claimed is:

1. A data output circuit of a semiconductor device, the data output circuit comprising:
    a plurality of data output drivers for generating plural-bit output data, wherein each data output driver comprises:
    a driver connected between an external power voltage and an external ground voltage, for pulling-up the output data in response to a first state of input data and for pulling-down the output data in response to a second state of the input data;
    a first delay circuit for varying a transition delay time of the input data having the first state, in response to signals received from other data output drivers of the plurality of data output drivers; and
    a second delay circuit for varying a transition delay time of the input data having the second state, in response to signals received from other data output drivers of the plurality of data output drivers.

2. The data output circuit of claim 1, wherein the first delay circuit comprises:
    a plurality of first switching devices, which are activated in response to the first state of the input data, for transitioning a level of the input data from the first state to the second state; and
    a plurality of first capacitors for delaying the transition delay time of the input data having the first state, wherein each of the first capacitors are connected to a corresponding one of the first switching devices and an internal ground voltage.

3. The data output circuit of claim 2, wherein each of the first switching devices comprises a first NMOS transistor.

4. The data output circuit of claim 2, wherein each of the first capacitors comprises a PMOS capacitor.

5. The data output circuit of claim 1, wherein the second delay circuit comprises:
    a plurality of second switching devices, which are activated in response to the second state of the input data, for transitioning a level of the input data from the second state to the first state; and
    a plurality of second capacitors for varying the transition delay time of the input data having the second state, wherein each of the second capacitors are connected to a corresponding one of the second switching devices and an internal grond voltage.

6. The data output circuit of claim 5, wherein each of the second switching devices comprises a second NMOS transistor.

7. The data output circuit of claim 5, wherein each of the second capacitors comprises a NMOS capacitor.

8. A semiconductor device, comprising:
    a controller for receiving plural-bit input data, wherein the plural-bit input data comprises a first group of bits that transition from a first state to a second state and a second group of bits that transition from the second state to the first state, and wherein the controller compares the number of bits in the first group and the number of bits in the second group to generate a falling transition delay time control signal and a rising transition delay time control singal, wherein each of the falling and rising transition delay time control signal controls transition delay time of the plural-bit input data; and
    a plurality of data output drivers for generating plural-bit output data in response to the plural-bit input data and the falling and rising transition delay time control singals.

9. The device of claim 8, wherein each data output driver comprises:
    a pull-up transistor, connected between an external power voltage and a data output terminal, for pulling-up output data in response to the first state of the plural-bit input data;
    a pull-down transistor, connected between the data output terminal and an external ground voltage, for pulling-down the output data in response to the second state of the plural-bit input data;
    a first delay circuit, connected to the pull-up transistor, for varying the transition delay time of the plural-bit input data having the first state in response to the rising transition delay time control signal and the first state of the plural-bit input data and; and
    a second delay ciruit, connected to the pull-down transistor, for varying the transition delay time of the plural-bit input data having the second state in response to the falling transition delay time control signal and the second state of the plural-bit input data.

10. The device of claim 9, wherein the first delay circuit comprises:
    a plurality of first switching devices for transitioning a level of the the plural-bit input data from the first state to the second state, in response to signals received from other data output drivers of the plurality of data output drivers; and a plurality of first capacitors for delaying the transition delay time of the plural-bit input data, wherein each of first capacitors are connected to a corresponding one of the first swiching devices and an internal ground voltage.

11. The device of claim 10, wherein each of the first switching devices comprises a first NMOS transistor.

12. The device of claim 10, wherein each of the first capacitors comprises a PMOS capacitor.

13. The device of claim 9, wherein the second delay circuit comprises:

a plurality of second switching devices for transitioning a level of the input data from the second state to the first state, in response to signals received from other data output drivers of the plurality of output data drivers; and a plurality of second capacitors for delaying the transition delay time of the plural-bit input data, wherein each of the second capacitors is connected to a corresponding one of the second switching devices and an internal ground voltage.

14. The device of claim 13, wherein each of the second switching devices comprises a second NMOS transistor.

15. The device of claim 13, wherein each of the second capacitors comprises a NMOS capacitor.

16. A semiconductor device, comprising:

a controller for receiving plural-bit input data, wherein the plural-bit input data comprises a first group of bits that transition from a first state to a second state and a second group of bits that transition from the second state to the first state, and wherein the controller compares the number of bits in the first group and the number of bits in the second group to generate a falling transition delay time control signal and a rising transition delay time control singal, wherein each of the falling and rising transition delay time control signal controls transition delay time of the plural-bit input data, respectively;

a plurality of clock signal generators for receiving a clock signal and generating a delayed clock signal with respect to each of the plural-bit input data in response to the rising transition delay time control signal and the falling transition delay time control signal, respectively;

a plurality of registers for receiving the plural-bit input data in response to the corresponding delayed clock signal, respectively; and a plurality of data output drivers for generating plural-bit output data in response to the output from the plurality of the registers, respectively.

17. The device of claim 16, wherein each of the data output drivers comprises:

a pull-up transistor, connected between an internal power voltage and a data output terminal, for pulling-up output data in response to the first state of the plural-bit input data;

a pull-down transistor, connected between the data output terminal and an internal ground voltage, for pulling-down the output data in response to the second state of the plural-bit input data;

a first delay circuit, connected to the pull-up transistor, for varying the transition delay time of the plural-bit input data having the first state in response to the rising transition delay time control signal and the first state of the plural-bit input data; and a second delay circuit, connected to the pull-down transistor, for varying the transition delay time of the the plural-bit input data having the second state in response to the falling transition delay time control signal and the second state of the plural-bit input data.

18. A method for outputting plural-bit output data in a semiconductor device comprising a plurality of data output drivers, in which the plurality of data output drivers are connected between an external power voltage and an external ground voltage, pull up the plural-bit output data in response to plural-bit input data of a first state, and pull down the plural-bit output data in response to the plural-bit input data of a second state, the method comprising the steps of:

receving a first group of the plural-bit input data that transition from the second state to the first state and a second group of the plural-bit input data that transition from the first state to the second state;

comparing the number of bits in the first group with the number of bits in the second group to generate a rising transition delay time control signal and a falling transition delay time control signal;

controlling transition delay time of the first group and the second group in response to the rising transition delay time control signal and the falling transition delay time control signal, respectively; and generating the plural-bit output data in response to the plural-bit input data.

19. The method of claim 18, wherein the step of controlling the trasition delay time of the first group and second group comprises the step of:

making the transition delay time by the rising transition delay time control signal longer than the transition delay time by the falling transition delay time control signal when the number of bits in the first group is greater than the number of bits in the second group; and making the transition delay time by the falling transition delay time control signal longer than the transition delay time by the rising transition delay time control signal when the number of bits in the second group is greater than the number of bits in the first group.

* * * * *